United States Patent [19]

Wanatowicz, Jr.

[11] 4,017,850
[45] Apr. 12, 1977

[54] MAGNETIC KEYSWITCH WITH TWO-PIECE SUPPORT ASSEMBLY

[75] Inventor: Edward W. Wanatowicz, Jr., Elk Grove Village, Ill.

[73] Assignee: Illinois Tool Works Inc., Chicago, Ill.

[22] Filed: Feb. 2, 1976

[21] Appl. No.: 654,429

[52] U.S. Cl. .................. 340/365 L; 84/DIG. 7; 178/101; 340/174 PM

[51] Int. Cl.² ................................ G08C 1/00

[58] Field of Search ... 340/365 L, 174 PM, 174 SP, 340/174 QB; 84/1.01, DIG. 7; 317/99; 178/101

[56] References Cited

UNITED STATES PATENTS

| | | | |
|---|---|---|---|
| 2,913,688 | 11/1959 | Slebodnick et al. | 340/365 L |
| 3,129,418 | 4/1964 | De La Tour | 340/173 SP |
| 3,696,345 | 10/1972 | Visschedijk | 340/173 PM |
| 3,714,611 | 1/1973 | Madland | 340/365 L |

Primary Examiner—Marshall M. Curtis
Attorney, Agent, or Firm—Glenn W. Bowen; Robert W. Beart

[57] ABSTRACT

A keyswitch for a keyboard is disclosed that has a support assembly which holds a saturable magnetic core and drive and sense line wires for the core. A plunger and magnet assembly that is depressible relative to the housing of the switch allows a permanent magnet to be moved away from the core when the plunger is depressed so the core can come out of magnetic saturation, thereby allowing signals from the drive line to be coupled to the sense line. The support assembly is formed of a two-piece construction that utilizes two identical molded plastic parts whereby the core and drive and sense line wires can be easily inserted into and removed from the support assembly.

10 Claims, 5 Drawing Figures

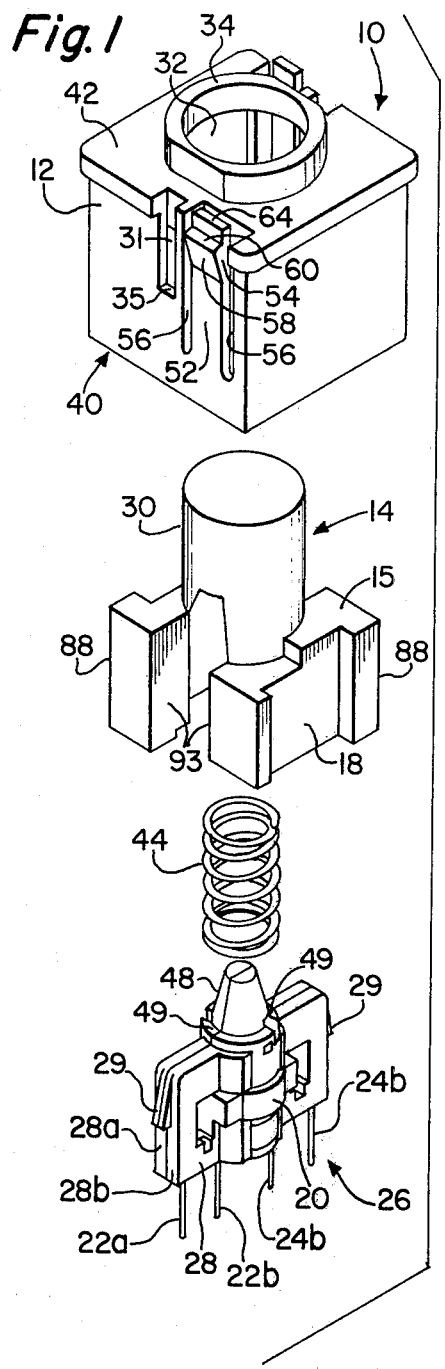
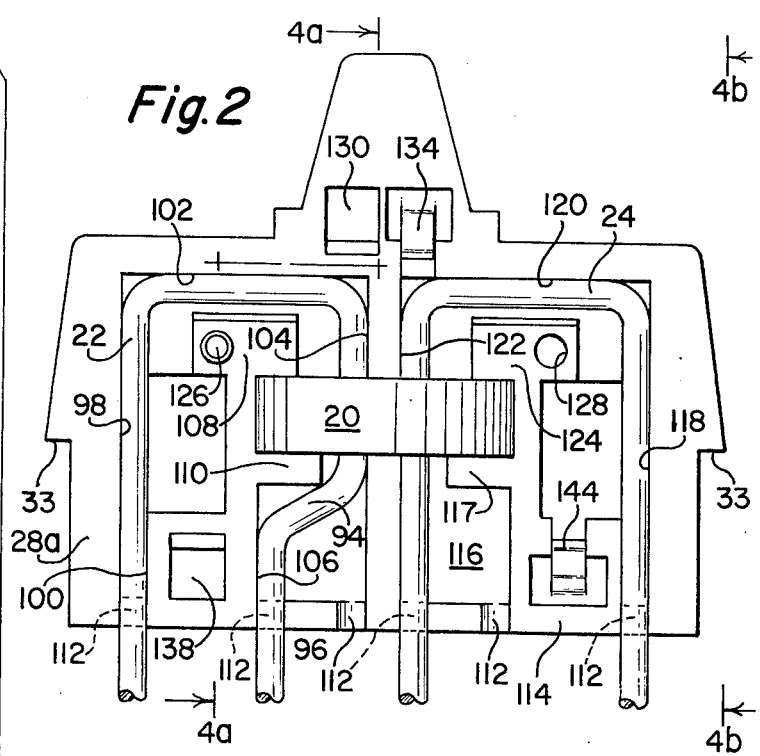
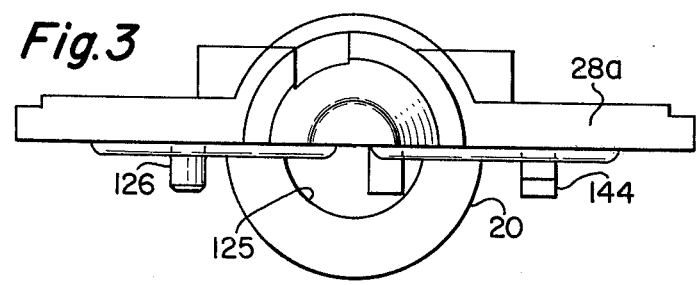
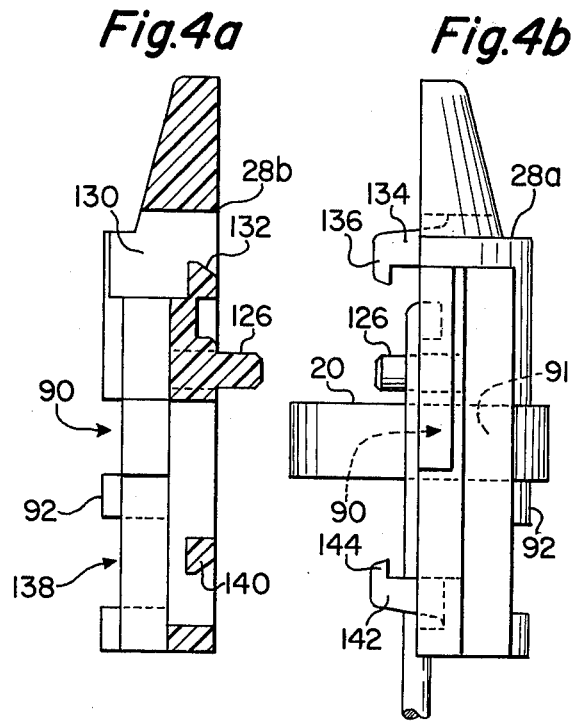

MAGNETIC KEYSWITCH WITH TWO-PIECE SUPPORT ASSEMBLY

BACKGROUND OF THE INVENTION

United States patent application Ser. No. 525,416 filed Nov. 20, 1974 in the names of Victor Bernin, Robert Madland and Carl Knoll and entitled, "Magnetic Keyswitch" is a Continuation of United States patent application Ser. No. 474,571 filed May 30, 1974 and now abandoned, which in turn was a Continuation of United States patent application Ser. No. 388,510 filed Aug. 15, 1973 and also now abandoned. These applications show a magnetic switch which utilizes a single saturable magnetic core that is mounted in a unitary insulating support assembly which also supports the drive line and sense line wires of the switch.

A unitary support assembly is a highly desirable feature for many applications since the depressible actuator and keystem of the switch can easily be separated from the magnetic core and its associated sense and drive line wires so that components of the switch, such as a return spring, can be replaced without complete dismantling of the switch, in particular, without unsoldering the drive and sense line wires from a printed circuit board to which they are connected.

The unitary support assembly of the aforementioned applications, however, was of a one-piece plastic construction in which the drive and sense line wires were molded into place in the support while the core was held in place by a pair of cantilevershaped flexible braces. While this construction provided the advantages noted above, it was difficult to manufacture since the drive and sense line wires had to be threaded through the core and the core had to be positioned in place at the molding station. In addition, the presence of the sense and drive line wires in the mold cause molding problems including mold breakages due to misalignment of the component parts.

The present invention is directed to a unitary support assembly which retains the desired advantages of the prior mentioned switch of the Bernin et al applications, but which is manufactured in a more economical and efficient manner. This is achieved by constructing the support assembly so that it has the same generally outer configuration as the support assembly of the Bernin et al applications, but so that it is formed of two identical molded plastic members which may be snapped together to form a support assembly wherein the core and drive and sense line wires may be inserted into the assembly away from the molded station.

The support assembly of the present invention has several desirable features not found in prior magnetic keyswitches of this type. First, the core is allowed to float in its restraining receptacle that is supported in the support assembly when the two plastic members are snapped together. This eliminates any undue pressure on the core which could adversely affect its performance. Next, the molded plastic members are formed so that the drive and sense line wires may be placed in the support assembly on either side of the core despite the fact that one of them preferably has a bend in it to provide greater separation between the terminal ends of the wires. In addition, the support formed by the two molded plastic members has a projecting guide means thereon that prevents the magnets on the plunger from rubbing against the core so as to prevent another possible source of keyswitch failure.

DESCRIPTION OF THE DRAWINGS

The present invention is illustrated by reference to the drawings in which:

FIG. 1 is an exploded perspective view of the keyswitch of the present invention;

FIG. 2 is a front view of the support assembly with the core and drive and sense line wires in place, but with one of the plastic members removed;

FIG. 3 is a top view of FIG. 2;

FIG. 4a is a cross-sectional view of a plastic support member taken along the line 4a/4a of FIG. 2; and FIG. 4b is an end view of a plastic support member viewed along the line 4b/4b of FIG. 2.

TECHNICAL DESCRIPTION OF THE INVENTION

The switch 10 of the present invention consists basically of four main parts which are assembled together. These are: a plastic housing 12, a plunger and magnet assembly 14, a support assembly 26 comprising the magnetic core 20, a plastic element 28 and at least one drive line wire and one sense line wire 22, 24, which thread the core 20 and are supported by the support element 28, and a return spring 44 for the plunger and magnet assembly 14.

The plunger 15, which holds the magnets 18, is preferably formed of plastics and is relatively rigid. The plunger and magnet assembly 14 consist of an upwardly projecting key post 30 which extends through the aperture 32 in the boss into the interior of the housing 12. The key post 30 is centered in the aperture 32 and it rides on a number of bearing surfaces. The top of the housing 12 is closed by the top plate 42 onto which the boss 34 is integrally formed.

When the magnets 18 are positioned adjacent the core 20 and the key post 30 is not depressed, the toroidal magnetic core 20 will be in a magnetically saturated condition. Therefore, pulse signal information, that is supplied to the drive line wire 22, will not be transformer coupled to the sense line wire 24 at this time. However, when a downward force is applied to the key post 30 and the magnets 18 are moved down away from the core 20, the core 20 will come out of saturation and this allows pulse signal information on the drive line wire 22 to be coupled to the sense line wire 24 where it can be delivered to a read-out circuit.

The plastic support element 28 is formed of two identical molded plastic parts 28a and 28b which are snapped together to form a support element for supporting a magnetic core 20 and a generally U-shaped drive and sense line wires 22, 24. The terminal ends 22a, 22b, 24a and 24b of the drive and sense line wires 22, 24 extend below the support assembly 26 to substantially the same level so that they may be easily inserted into apertures in a printed circuit board. The support element 28 of the support assembly 26 also has a pair of integrally formed upwardly projecting wedges 29 on its upper portion. The wedges 29 project into the apertures 31 to lock the support assembly 26 into place in the housing 12. A spring seat post 48, half of which is formed on the top of each of the plastic support members 28a, 28b, overlies the magnetic core 20 where the two plastic support members are locked together. The return spring 44 for the plunger and magnet assembly 14 fits over the post 48. The bottom of the spring 44 is seated on the surface 49 and the top of the spring 44 is inserted into a cylindrical passageway (not shown) in the interior of the depressible key post 30 so that the upper end of the spring 44 abuts the upper surface of the passageway.

The housing 12 is also provided with a pair of resilient arms 52 which have locking tabs 54. The locking tabs 54 have lower angled surfaces 58 which cause the arms 52 to be flexed inwardly when the switch 10 is depressed down into its aperture in the keyboard support plate since they are separated from the remainder of the housing 12 by slots 56. Once the switch 10 is in place, the arms 52 will unflex and the upper angled surfaces 60 of the locking tabs 54 will engage the keyboard support plate to lock the switch 10 in position. The switch 10, however, can be removed from the keyboard support plate if sufficient pressure is applied to the release tab 64 to again flex the arms 52 inwardly by an amount sufficient to allow removal of the switch 10 from the keyboard support plate.

The plastic plunger 15 of the plunger and magnet assembly 14 holds a pair of permanent magnets 18 on its lower portion. Corresponding guide channels (not shown) for receiving the guide members 88 that are formed on the plunger 15 are provided in the inner surfaces of the walls of the housing 12.

As previously mentioned, the housing 12 contains a pair of rectangular-shaped apertures 31 on opposite sides of the housing 12. The apertures 31 are provided to receive the wedges 29 of the support assembly 26 in order to lock the support assembly into the housing 12. The plunger and magnet assembly 14 is inserted into the housing 12 through the open bottom 40 so that the key post 30 is positioned through the aperture 32. The spring 44 will then be positioned in place in the cylindrical passageway in the key post 30. Because of the downwardly sloped shape of the wedges 29, the support assembly 26 can be readily inserted into the housing 12 by application of an upward force to it. When the support assembly 26 is in place, the lower surfaces 33 of the wedges 29 will engage the adjacent surfaces 35 at the bottom of the associated aperture 31, thereby locking the support assembly 26 in place in the housing 12.

While the downward sloped shape of the wedges 29 makes it easier to insert the support assembly 26 into the housing 12, it tends to prevent removal of the support assembly merely by the application of a downward force to it. The support assembly 26, however, may be easily removed from the housing 12 if the slots of the housing are flexible so that the application of a sufficient amount of pressure to one pair of walls will flex the opposite pair of walls sufficiently so that the surfaces 33 of the wedges 29 will clear the surfaces 35, thereby allowing for removal of the support element 28 from the housing 12.

The support element 28 of the present invention is best understood by reference to FIGS. 2, 3 4a and 4b. As previously mentioned, the support element 28 is formed of two identical molded plastic members 28a, 28b. FIG. 1a shows one of the molded plastic members 28a and its position relative to the core 20 and to the drive and sense line wires 22, 24. The drive and sense line wires 22, 24 are threaded through the central aperture 25 of the core 20 and the core is thus positioned in the receptacle that is formed in the support element 28 by openings 90 and the walls 91 adjacent the openings so that part of the outer periphery of the core 20 extends through the openings 90. The core thus "floats", or is retained, in this area in a loose manner so that it may actually be rotated around in the support assembly when the two members 28a, 28b are snapped together.

This loose, or floating, fit prevents any pressure from being applied to the core which could adversely affect the operation of the keyswitch. Below the openings 90 are the projecting guide members 92. The guide members 92 extend outwardly so as to engage a corresponding outwardly projecting surface 93 of the plastic plunger 15 and to act as a guide for guiding the magnets 18 on the plunger 15 past the core 20 without rubbing against it, thus eliminating another possible source of faulty operation of the keyswitch.

Either one of the wires 23, 24, for example, the drive line wire 22 as shown in FIG. 2, may be formed with a bend 94 in order to increase the separation of terminal ends 22b and 24a of the drive and sense line wires 22, 24 to provide for sufficient clearance between the terminal ends for reliable printed circuit connections. The drive line wire 22 is placed in the recess 96 in the member 28a and the walls 98, 100, 102, 104 and 106 and the integrally formed blocks 108, 110 act to retain the wire 22 in place. The terminals 22a, 22b extend out of the member 28a through the two leftmost semi-circular openings 112 that are formed in the base 114 of the plastic member 28a. When the plastic member 28a, 28b are snapped together, these semi-circular openings, of course, form a circular opening for the leads. In a similar manner, the sense wire 24 is placed in the recess 116 and it is retained in place by the walls 118, 120, 122 and the block 124.

An important feature of the support assembly of the present invention is that the drive and sense wires may be reversed during assembly, thereby eliminating assembly errors and making manufacture of the keyboard easier and simpler. When the wires 22, 24 are reversed, the drive line wire 22 is positioned in the right-hand recess 116 with its bend 94 adjacent the block 117 and its left-hand terminal end projecting through the second aperture 112 from the right in the base 114 just below the recess 116. The sense line wire 24 will then be positioned in the recess 96 and its right hand terminal end will project through the third aperture 112 from the left-hand side of the member 28.

The block 108 has an integrally projecting peg 126 formed on it, and the block 124 has a hole 128 in it. The peg of one plastic member of the support element is thereby insertable into the hole in the other plastic member to assist in positioning the two plastic members 28a, 28b correctly relative to one another. The molded plastic members 28a, 28b also have an aperture 130 formed near their top central portion which has an upwardly projecting locking ledge formed therein. Adjacent to the aperture 130 is a projecting flexible latch member 134 with a downwardly extending finger 136 that is locked against the ledge 132 when the members 28a, 28b are secured together. The lower end of the plastic members 28a, 28b also is formed to have an aperture 138 with a downwardly projecting locking ledge 140 on the left side of the member, as viewed in FIG. 2, while a projecting flexible latch member 142 with an upwardly extending finger 144 locked on the right side of the member. The finger 144 of one member is thereby locked against a ledge 132 of the other member when the two members 28a, 28b are snapped together. The described support assembly thus allows for the assembly of the core 20 and the drive and sense line wires 22, 24 into the support element 28 at a location remote from the mold, in order to substantially reduce molding problems, including mold breakage. In addition, if a core 20 does become defective, it may be individually replaced without replacing the entire support assembly, as was previously necessary.

The invention is claimed as follows:

1. A keyboard switch comprising a housing, an actuating member and at least one permanent magnet coupled to said actuating member so as to change from a first position to a second position when said actuating member is actuated, a support assembly comprising at least one magnet core, a drive wire threaded through said core, at least one sense wire threaded through said core and an electrically insulating support element for supporting said magnetic core in a loosely retained manner and for also supporting said drive and sense wires, said drive and sense wires being configured so that their terminating permanent ends may be connected into the apertures of a printed circuit board, said magnetic core being magnetically saturated when said permanent magnets are in one of their positions and said magnetic core being unsaturated when said permanent magnets are in other of their positions, said support assembly comprising two substantially identical molded plastic members which receive said core therein and interlocking, snapped-together retention means provided on said plastic members whereby the insertion of said core and said drive and sense wires may be achieved at a location remote from the location at which said plastic members are molded.

2. A keyboard switch as claimed in claim 1 wherein said retention means comprises at least one locking ledge on one plastic member and a mating flexible latch means on the other plastic member which interlock to hold said plastic members together.

3. A keyboard switch as claimed in claim 1 wherein said retention means comprises a first locking ledge, a first latch means adjacent said first locking ledge which has a first finger formed thereon and which is located on the upper portion of said plastic members wherein said first locking ledge extends upwardly and said first finger extends downwardly, a second locking ledge located on a first side of a lower portion of said plastic members and a second latch means which has a second finger formed thereon and which is located on a second side of the lower portion of said plastic members wherein said second locking ledge extends downwardly and said second finger extends upwardly.

4. A keyboard switch as claimed in claim 1 wherein each of said plastic members have an opening therein which allow a portion of the periphery of said core to extend therethrough.

5. A keyboard switch as claimed in claim 1 wherein said support element is formed so that the positions of said sense and drive wires may be interchanged.

6. A keyboard switch as claimed in claim 1 wherein said support element is formed with projecting guide means which engage and guide said actuating member so that said permanent magnet passes past the said core without contact therewith.

7. A keyboard switch as claimed in claim 5 wherein said support element is formed with projecting guide means which engage and guide said actuating member so that said permanent magnet passes past said core without contact therewith.

8. A keyboard switch as claimed in claim 7 wherein said retention means comprises at least one locking ledge on one plastic member and a mating flexible latch means on the other plastic member which interlock to hold said plastic members together.

9. A keyboard switch as claimed in claim 8 wherein each of said plastic members have an opening therein which allow a portion of the periphery of said core to extend therethrough, said apertures being located adjacent said guide means.

10. A keyboard switch as claimed in claim 9 wherein said retention means comprises first locking ledge, a first latch means adjacent said first locking ledge which has a first finger formed thereon and which is located on the upper portion of said plastic members wherein said first locking ledge extends upwardly and said first finger extends downwardly, a second locking ledge located on a first side of a lower portion of said plastic members, and a second latch means which has a second finger formed thereon and which is located on a second side of the lower portion of said plastic members wherein said second locking ledge extends downwardly and said second finger extends upwardly.

* * * * *